US010016937B2

(12) United States Patent
Napadensky

(10) Patent No.: US 10,016,937 B2
(45) Date of Patent: Jul. 10, 2018

(54) SYSTEM AND METHOD FOR ADDITIVE MANUFACTURING OF AN OBJECT

(71) Applicant: Stratasys Ltd., Rehovot (IL)

(72) Inventor: Eduardo Napadensky, Natania (IL)

(73) Assignee: Stratasys Ltd., Rehovot (IL)

( * ) Notice: Subject to any disclaimer, the term of this patent is extended or adjusted under 35 U.S.C. 154(b) by 0 days.

(21) Appl. No.: 15/494,577

(22) Filed: Apr. 24, 2017

(65) Prior Publication Data
US 2017/0225390 A1 Aug. 10, 2017

Related U.S. Application Data

(63) Continuation of application No. 14/112,252, filed as application No. PCT/IL2012/050137 on Apr. 17, 2012, now Pat. No. 9,649,811.
(Continued)

(51) Int. Cl.
*B29C 67/00* (2017.01)
*B33Y 30/00* (2015.01)
(Continued)

(52) U.S. Cl.
CPC ...... *B29C 67/0059* (2013.01); *B29C 35/0805* (2013.01); *B33Y 10/00* (2014.12);
(Continued)

(58) Field of Classification Search
CPC ............ B29C 67/005; B29C 35/0805; B29C 2035/0827; H05K 3/125; H05K 3/1283;
(Continued)

(56) References Cited

U.S. PATENT DOCUMENTS 4,747,069 A * 5/1988 Grinberg ................. G06E 3/005
708/801
4,764,891 A * 8/1988 Grinberg ................. G06E 3/005
708/191
(Continued)

FOREIGN PATENT DOCUMENTS

EP 1013407 6/2000
JP 07-040445 2/1995
(Continued)

OTHER PUBLICATIONS

Notice of Reason for Rejection dated Aug. 1, 2017 From the Japan Patent Office Re. Application No. 2016-167978. (3 Pages).
(Continued)

*Primary Examiner* — Nahida Sultana

(57) ABSTRACT

A method of additive manufacturing of a three-dimensional object is disclosed. The method comprises sequentially forming a plurality of layers each patterned according to the shape of a cross section of the object. In some embodiments, the formation of at least one of the layers comprises performing a raster scan to dispense at least a first building material composition, and a vector scan to dispense at least a second building material composition. The vector scan is optionally along a path selected to form at least one structure selected from the group consisting of (i) an elongated structure, (ii) a boundary structure at least partially surrounding an area filled with the first building material, and (iii) an inter-layer connecting structure.

18 Claims, 5 Drawing Sheets

Related U.S. Application Data

(60) Provisional application No. 61/476,275, filed on Apr. 17, 2011.

(51) Int. Cl.
| | |
|---|---|
| *H05K 1/09* | (2006.01) |
| *B33Y 10/00* | (2015.01) |
| *B29C 35/08* | (2006.01) |
| *B33Y 70/00* | (2015.01) |
| *H05K 3/12* | (2006.01) |
| *B29L 31/34* | (2006.01) |

(52) U.S. Cl.
CPC .............. *B33Y 30/00* (2014.12); *B33Y 70/00* (2014.12); *H05K 1/092* (2013.01); *H05K 3/125* (2013.01); *H05K 3/1283* (2013.01); *B29C 2035/0827* (2013.01); *B29K 2995/0005* (2013.01); *B29L 2031/3425* (2013.01)

(58) Field of Classification Search
CPC .................... B33Y 10/00; B33Y 70/00; B29K 2995/0005; B29L 2031/3425
See application file for complete search history.

(56) References Cited

U.S. PATENT DOCUMENTS

| | | | |
|---|---|---|---|
| 4,944,817 A | 7/1990 | Bourell et al. | |
| 5,002,855 A | 3/1991 | Fan et al. | |
| 5,151,813 A | 9/1992 | Yamamoto et al. | |
| 5,922,364 A | 7/1999 | Young, Jr. | |
| 6,136,252 A | 10/2000 | Bedal et al. | |
| 6,169,605 B1 | 1/2001 | Penn et al. | |
| 6,179,601 B1 | 1/2001 | Kruger et al. | |
| 6,193,923 B1 | 2/2001 | Leyden et al. | |
| 6,347,257 B1 | 2/2002 | Bedal et al. | |
| 6,357,855 B1 | 3/2002 | Kerekes et al. | |
| 6,399,010 B1 * | 6/2002 | Guertin .............. | G05B 19/4099 264/308 |
| 6,532,394 B1 | 3/2003 | Earl et al. | |
| 6,596,224 B1 * | 7/2003 | Sachs ...................... | B22F 3/008 264/113 |
| 6,713,389 B2 * | 3/2004 | Speakman ................. | B41J 2/01 257/E29.151 |
| 7,108,733 B2 * | 9/2006 | Enokido ............... | B22F 1/0022 252/512 |
| 7,993,123 B2 | 8/2011 | Wigand et al. | |
| 9,765,193 B2 * | 9/2017 | Hirata .................... | B33Y 80/00 |
| 9,776,376 B2 * | 10/2017 | Swartz ...................... | B32B 5/26 |
| 2001/0003004 A1 | 6/2001 | Leyden et al. | |
| 2005/0263933 A1 | 12/2005 | Welch, IV et al. | |
| 2006/0225834 A1 | 10/2006 | Medina et al. | |
| 2007/0179657 A1 | 8/2007 | Holzwarth | |
| 2009/0004381 A1 | 1/2009 | Fujisawa et al. | |
| 2009/0123702 A1 * | 5/2009 | Yoshizawa ........... | H05K 1/0256 428/156 |
| 2010/0021638 A1 | 1/2010 | Varanka et al. | |
| 2010/0145469 A1 | 6/2010 | Barralet et al. | |
| 2010/0191360 A1 | 7/2010 | Napadensky et al. | |
| 2013/0270746 A1 | 10/2013 | Elsey | |
| 2014/0036455 A1 | 2/2014 | Napadensky | |

FOREIGN PATENT DOCUMENTS

| | | |
|---|---|---|
| JP | 2002-507940 | 3/2002 |
| JP | 2008-098280 | 4/2008 |
| WO | WO 98/56566 | 12/1998 |
| WO | WO 99/19900 | 4/1999 |
| WO | WO 02/20251 | 3/2002 |
| WO | WO 02/47447 | 6/2002 |
| WO | WO 2012/143923 | 10/2012 |

OTHER PUBLICATIONS

Translation of Notice of Reason for Rejection dated Aug. 1, 2017 From the Japan Patent Office Re. Application No. 2016-167978. (6 Pages).
Official Action dated Aug. 17, 2016 From the US Patent and Trademark Office Re. U.S. Appl. No. 14/112,252.
Restriction Official Action dated Jun. 9, 2015 From the US Patent and Trademark Office Re. U.S. Appl. No. 14/112,252.
Office Action dated Dec. 4, 2017 From the Israel Patent Office Re. Application No. 228914 and Its Translation Into English. (5 Pages).
Communication Pursuant to Article 94(3) EPC dated May 18, 2015 From the European Patent Office Re. Application No. 12723927.5.
Communication Pursuant to Article 94(3) EPC dated May 30, 2016 From the European Patent Office Re. Application No. 12723927.5.
Communication Relating to the Results of the Partial International Search dated Sep. 6, 2012 From the International Searching Authority Re. Application No. PCT/IL2012/050137.
Corrected International Search Report and the Written Opinion dated Jan. 3, 2013 From the International Searching Authority Re. Application No. PCT/IL2012/050137.
International Preliminary Report on Patentability dated Oct. 31, 2013 From the International Bureau of WIPO Re. Application No. PCT/IL2012/050137.
International Search Report and the Written Opinion dated Dec. 13, 2012 From the International Searching Authority Re. Application No. PCT/IL2012/050137.
Notice of Allowance dated Jan. 11, 2017 From the US Patent and Trademark Office Re. U.S. Appl. No. 14/112,252. (7 Pages).
Notice of Reasons for Rejection dated Dec. 15, 2015 From the Japanese Patent Office Re. Application No. 2014-505781 and Its Translation Into English.
Notification of Office Action dated Jan. 15, 2016 From the State Intellectual Property Office of the People's Republic of China Re. Application No. 201280023976.X and Its Translation Into English.
Notification of Office Action dated Jul. 25, 2016 From the State Intellectual Property Office of the People's Republic of China Re. Application No. 201280023976.X and Its Translation Into English.
Notification of Office Action dated Jul. 25, 2016 From the State Intellectual Property Office of the People's Republic of China Re. Application No. 201280023976.X.
Notification of Office Action dated Mar. 25, 2015 From the State Intellectual Property Office of the People's Republic of China Re. Application No. 201280023976.X and Its Translation Into English.
Office Action dated Feb. 13, 2017 From the Israel Patent Office Re. Application No. 228914 and Its Translation Into English. (9 Pages).
Official Action dated Nov. 10, 2015 From the US Patent and Trademark Office Re. U.S. Appl. No. 14/112,252.

* cited by examiner

SYSTEM AND METHOD FOR ADDITIVE MANUFACTURING OF AN OBJECT

RELATED APPLICATIONS

This application is a Continuation of U.S. patent application Ser. No. 14/112,252 filed on Oct. 17, 2013, which is a National Phase of PCT Patent Application No. PCT/IL2012/050137 having International Filing Date of Apr. 17, 2012, which claims the benefit of priority of U.S. Provisional Patent Application No. 61/476,275 filed on Apr. 17, 2011. The contents of the above applications are hereby incorporated by reference as if fully set forth herein.

FIELD AND BACKGROUND OF THE INVENTION

The present invention, in some embodiments thereof, relates to Additive Manufacturing (AM) of an object, more particularly, but not exclusively, to a system and method for additive manufacturing of an object using a combination of materials and/or scanning patterns.

Additive manufacturing is generally a process in which a three-dimensional (3D) object is manufactured utilizing a computer model of the object. Such a process is used in various fields, such as design related fields for purposes of visualization, demonstration and mechanical prototyping, as well as for rapid manufacturing (RM).

The basic operation of any AM system consists of slicing a three-dimensional computer model into thin cross sections, translating the result into two-dimensional position data and feeding the data to control equipment which manufacture, in a layerwise manner, a three-dimensional structure on a working surface.

Additive manufacturing entails many different approaches to the method of fabrication, including three-dimensional printing, laminated object manufacturing, fused deposition modeling and others.

In three-dimensional printing processes, for example, a building material is dispensed from a dispensing head having a set of nozzles to deposit layers on a supporting structure. Depending on the building material, the layers may then be cured or solidified using a suitable device. The building material may include modeling material, which forms the object, and support material, which supports the object as it is being built. Various three-dimensional printing techniques exist and are disclosed in, e.g., U.S. Pat. Nos. 6,259,962, 6,569,373, 6,658,314, 6,850,334, 7,183,335 7,209,797, 7,225,045, 7,300,619, 7,479,510, 7,500,846, 7,658,976 and 7,962,237, and U.S. Published Application No. 20100191360, all of the same Assignee, the contents of which are hereby incorporated by reference.

AM facilitates rapid fabrication of functioning prototypes with minimal investment in tooling and labor. Such rapid prototyping shortens the product development cycle and improves the design process by providing rapid and effective feedback to the designer. AM can also be used for rapid fabrication of non-functional parts, e.g., for the purpose of assessing various aspects of a design such as aesthetics, fit, assembly and the like. Additionally, AM techniques have been proven to be useful in the fields of medicine, where expected outcomes are modeled prior to performing procedures. It is recognized that many other areas can benefit from rapid prototyping technology, including, without limitation, the fields of architecture, dentistry and plastic surgery where the visualization of a particular design and/or function is useful.

The deposition of materials according to two-dimensional position data to form a layer can generally be accomplished by establishing a relative lateral motion between the dispensing device (e.g., printing head, extrusion nozzle, etc.) and the working surface along some motion pattern. Known in the art are two types of motion patterns, referred to as "raster scan" and "vector scan." Raster scan is characterized by a back and forward relative motion between the dispensing device and working surface, typically using several nozzles for parallel deposition. During the raster scan all the locations on the working surface are visited by the dispensing device, wherein a controller selectively activates and deactivates the dispensing nozzles for each visited location according to the two-dimensional position data. In vector scan, the dispensing device does not visit all the locations on the working surface. Instead, the relative motion is along a path selected based on the locations at which material deposition is required.

U.S. Pat. No. 6,193,923 to Leyden discloses a rapid prototyping technique in which a print head is displaced over a working surface in both a scanning direction and an index direction. Leyden teaches two scanning protocols. In one protocol a motion of the printing head in the main scanning direction is followed by a smaller increment of movement in a secondary scanning direction while no dispensing occurs, which in turn is followed by a reverse scan in the main scanning direction in which dispensing again occurs. In another protocol, the small secondary scanning movements are performed while main scanning occurs. Leyden also discloses vector scanning and a combination of vector scanning and raster scanning.

Several AM techniques allow additive formation of objects using more than one modeling material. For example, U.S. Published Application No. 20100191360 of the present Assignee, the contents of which are hereby incorporated by reference, discloses a system which comprises an additive manufacturing apparatus having a plurality of dispensing heads, a building material supply apparatus configured to supply a plurality of building materials to the fabrication apparatus, and a control unit configured for controlling the fabrication and supply apparatus. The system has several operation modes. In one mode, all dispensing heads operate during a single building scan cycle of the fabrication apparatus. In another mode, one or more of the dispensing heads is not operative during a single building scan cycle or part thereof.

SUMMARY OF THE INVENTION

According to an aspect of some embodiments of the present invention there is provided a method of additive manufacturing of a three-dimensional object. The method comprises sequentially forming a plurality of layers each patterned according to the shape of a cross section of the object, thereby forming the object. In some embodiments of the present invention, the formation of at least one of the layers comprises performing a raster scan to dispense at least a first building material composition, and a vector scan to dispense at least a second building material composition. The vector scan is optionally along a path selected to form at least one structure selected from the group consisting of (i) an elongated structure, (ii) a boundary structure at least partially surrounding an area filled with the first building material, and (iii) an inter-layer connecting structure.

According to some embodiments of the invention the first building material composition is different from the second building material composition.

According to some embodiments of the invention the first building material composition is generally non-electrically conductive, and the second building material is generally electrically conductive.

According to some embodiments of the invention at least one of the first and the second building material compositions comprises a UV curable component.

According to some embodiments of the invention the first and the second building material compositions are at different temperatures during the dispensing.

According to some embodiments of the invention the structure is embedded within an area formed by the raster scan.

According to some embodiments of the invention the structure is a peripheral with respect to the layer.

According to some embodiments of the invention the path is selected to form a plurality of lines embedded in an area formed by the raster scan.

According to some embodiments of the invention the vector scan is at least partially simultaneous with the raster scan.

According to some embodiments of the invention the vector scan and the raster scan are performed sequentially.

According to some embodiments of the invention the at least one layer is an inner layer within the plurality of layers.

According to some embodiments of the invention the at least one layer is a topmost or a bottommost layer among the plurality of layers.

According to some embodiments of the invention the at least one layer comprises at least two layers.

According to some embodiments of the invention the method comprises evaporating solvent from the second building material. According to some embodiments of the invention the solvent comprises water.

According to an aspect of some embodiments of the present invention there is provided a circuitry producible by a method described herein.

According to an aspect of some embodiments of the present invention there is provided an article of manufacture, comprising a plurality of layers made of non-electrically conductive UV curable material and fabricated via three-dimensional printing, wherein at least one layer of the plurality of layers comprises a pattern of conductive lines made of electrically conductive material.

According to some embodiments of the invention the electrically conductive material is UV curable.

According to an aspect of some embodiments of the present invention there is provided a circuitry comprising the article of manufacture described herein.

According to an aspect of some embodiments of the present invention there is provided an optoelectronic system comprising the circuitry described herein.

According to an aspect of some embodiments of the present invention there is provided a sensor comprising the circuitry described herein.

According to an aspect of some embodiments of the present invention there is provided a diode system comprising the circuitry described herein.

According to an aspect of some embodiments of the present invention there is provided a transistor system comprising the circuitry described herein.

According to an aspect of some embodiments of the present invention there is provided a memory system comprising the circuitry described herein.

According to an aspect of some embodiments of the present invention there is provided an imaging system comprising the circuitry described herein.

According to an aspect of some embodiments of the present invention there is provided a display system comprising the circuitry described herein.

According to an aspect of some embodiments of the present invention there is provided a projector display system comprising the circuitry described herein.

According to an aspect of some embodiments of the present invention there is provided an identification tag system comprising the circuitry described herein.

According to an aspect of some embodiments of the present invention there is provided a smart card system comprising the circuitry described herein.

According to an aspect of some embodiments of the present invention there is provided a battery comprising the circuitry described herein.

According to an aspect of some embodiments of the present invention there is provided a system for additive manufacturing of a three-dimensional object. The system comprises a first dispensing head configured for performing a raster scan and dispensing a first building material composition during the raster scan. The system further comprises a second dispensing head configured for performing a vector scan and dispensing a second building material composition during the vector scan. The system further comprises a controller for controlling the first dispensing head and the second dispensing head to sequentially form a plurality of layers in a configured pattern corresponding to the shape of the object. In some embodiments of the present invention the controller is configured to control the second dispensing head to dispense the second building material composition along a path selected to form at least one structure selected from the group consisting of (i) an elongated structure, (ii) a boundary structure at least partially surrounding an area filled with the first building material, and (iii) an inter-layer connecting structure.

According to some embodiments of the invention the controller is configured to form at least one layer by establishing a raster scan of the first head to dispense a non-electrically conductive modeling material and a vector scan of the second head to dispense an electrically conductive material.

According to some embodiments of the invention at least one of the first and the second building materials is UV curable, and the system further comprises a radiation source.

According to some embodiments of the invention the path is embedded within an area formed by the raster scan.

According to some embodiments of the invention the path is selected to form a plurality of conductive lines embedded within an area formed by the raster scan.

According to some embodiments of the invention the first and the second heads are configured to move independently.

According to some embodiments of the invention the first head is rigidly attached to the second head.

According to some embodiments of the invention the vector scan is at least partially simultaneous with the raster scan.

According to some embodiments of the invention the vector scan and the raster scan are performed sequentially.

According to some embodiments of the invention the at least one layer is an inner layer within the plurality of layers.

According to some embodiments of the invention the at least one layer is a topmost or a bottommost layer among the plurality of layers.

According to some embodiments of the invention the at least one layer comprises at least two layers.

According to an aspect of some embodiments of the present invention there is provided a method of additive manufacturing of a three-dimensional object. The method comprises sequentially forming a plurality of layers each patterned according to the shape of a cross section of the object, thereby forming the object. In some embodiments of the present invention the formation of at least one of the layers comprises dispensing at least a first building material composition at a temperature above 60° C. and at least a second building material composition at a temperature below 40° C.

According to some embodiments of the invention the first building material composition is generally non-electrically conductive, and the second building material is generally electrically conductive.

According to some embodiments of the invention the dispensing of the first building material composition is characterized by raster scan.

According to some embodiments of the invention the dispensing of the second building material composition is characterized by raster scan.

According to some embodiments of the invention the dispensing of the second building material composition is characterized by vector scan.

According to some embodiments of the invention at least one of the first building material composition and the second building material composition is UV curable.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1A:
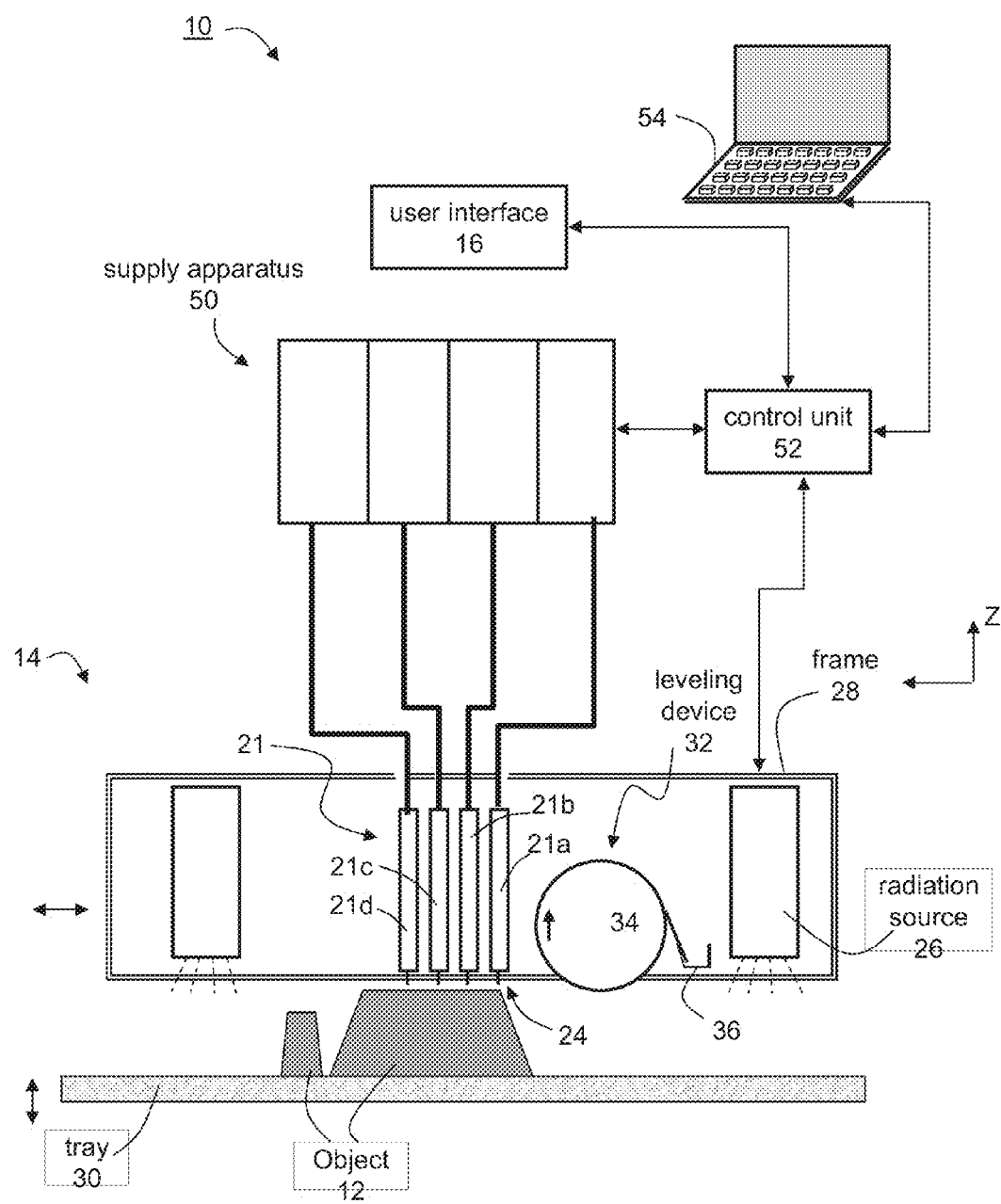
FIGS. 1A-1C are schematic illustrations of an additive manufacturing system according to some embodiments of the present invention.

The present invention, in some embodiments thereof, relates to Additive Manufacturing (AM) of an object, more particularly, but not exclusively, to a system and method for additive manufacturing of an object using a combination of materials and/or scanning patterns.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The method and system of the present embodiments manufacture three-dimensional objects in a layerwise manner by forming a plurality of layers in a configured pattern corresponding to the shape of the objects.

The term "object" as used herein refers to a whole object or a part thereof.

Each layer is formed by AM apparatus which scans a two-dimensional surface and patterns it. In some embodiments of the present invention the AM apparatus is a three-dimensional printing apparatus.

The scanning of the AM apparatus of the present embodiments can include raster and/or vector scan.

As used herein "raster scan" refers to a scanning mode in which the relative motion between the dispensing head of the AM apparatus and the working surface is always parallel to one or two straight lines. In this scanning mode, the deposition is preferably only during the relative motion along a straight line.

A representative example of a raster scan is as follows. The dispensing head moves in a main scanning direction which is parallel to the working surface. While scanning, the apparatus visits a plurality of target locations on the two-dimensional layer or surface, and decides, for each target location or a group of target locations, whether or not the target location or group of target locations is to be occupied by building material, and which type of building material is to be delivered thereto. The decision is made according to a computer image of the surface.

Optionally, once a full scan along the main scanning direction is completed, the dispensing head optionally moves in an indexing direction without dispensing building material. The indexing direction is also parallel to the working surface but is orthogonal to the main scanning direction. The dispensing head can also perform a reverse scan in the main scanning direction during which it selectively dispenses the building material. The motion in the indexing direction can be at any stage of the scan.

For example, the motion in the indexing direction can be after each reverse scan is completed or between every two successive forward and reverse scans as known in the art. The dispensing head can includes a plurality of nozzles arranged along the indexing direction, thus reducing the number of scans that are required for completing the layer.

The series of scans performed by the dispensing head during the formation of a single layer in a raster scan is referred to herein as a single scan cycle. The main scanning direction is referred to herein as the X direction, and the indexing direction is referred to herein as the Y direction. The X and Y directions are typically parallel to the boundaries of the working surface.

As used herein "vector scan" refers to a scanning mode in which the relative motion between the dispensing head of the AM apparatus and the working surface is along a path which is selected dynamically by a controller according to the computer image of the layer.

Optionally, the path is curved. Optionally, at least part of the path is not parallel to the boundaries of the working surface onto which the dispensing occurs.

Thus, unlike raster scan in which any motion of the dispensing head is parallel to the X or Y directions, the motion in vector scan can be along any path, not necessarily parallel to the X or Y directions.

Typically, the AM apparatus of the present embodiments scans the working surface in several passes. This operation is applied when the width of the dispensing heads along the Y direction is smaller than the width of the working surface and/or when several objects are built on the same working surface during a single additive manufacturing batch.

In some embodiments of the present invention the AM apparatus selects the scanning mode based on the two-dimensional position data corresponding to the layer being built. In vector scan, the throughput of a given layer is governed by the area size to be covered by supporting or building materials, and therefore non-bulky objects are built faster than bulky ones. In raster scan, on the other hand, throughput is not governed necessarily by the area where material needs to be deposited, but it is governed by the number of scanning passes that the supporting or modeling material dispensing device is required to do in order to deposit those materials.

As a matter of example, building a bar with axis parallel to Z axis takes the same time as building a pipe of the same length and diameter, if printed using a raster scanning mode; while building the same bar takes much longer than building the same pipe if a vector scanning mode is used.

Thus in some embodiments, raster scanning is employed when the throughput obtained is similar or greater than the throughput obtained alternatively by vector scanning. This depends on system characteristics such as scanning speed of raster and vector, raster material deposition device width (in Y axis), layer thickness, etc.

In some embodiments, raster deposition is employed for depositing one or more materials and vector deposition is employed for deposition of one or more different materials, according to the properties or attributes of the materials being deposited and/or of the properties or attributes desired to be manifested in the final object, by usage and/or specific location of the particular materials selected for deposition.

In some embodiments, both raster scan and vector scan deposit materials by inkjet.

In some embodiments, the raster scan deposits material by inkjet while the vector scan deposits material using an alternative, different technology, for example, extrusion of a melted polymer, pressure based dispensing system of a liquid or paste like material.

The AM apparatus thus dispenses building material in target locations which are to be occupied and leaves other target locations void. The apparatus typically includes a plurality of dispensing heads, each of which can be configured to dispense a different building material. Thus, different target locations can be occupied by different building materials. In various exemplary embodiments of the invention the apparatus comprises one or more dispensing heads configured for performing a raster scan and one or more dispensing heads configured for performing a vector scan. One or more building materials dispensed by heads configured for performing raster scan may be different from one or more building materials dispensed by vector heads. Alternatively, one or more building materials dispensed by raster scanning heads may be the same as one or more materials dispensed by vector heads.

The types of building materials can be categorized into two major categories: modeling material and support material. The support material serves as a supporting matrix or construction for supporting the object or object parts during the fabrication process and/or other purposes, e.g., providing hollow or porous objects. Support constructions may additionally include modeling material elements, e.g. for further support strength.

The modeling material is generally a composition which is formulated for use in Additive manufacturing and which is able to form a three-dimensional object on its own, i.e., without having to be mixed or combined with any other substance.

The final three-dimensional object is made of the modeling material or materials or a combination of modeling and support materials or modification thereof (e.g., following curing). All these operations are well-known to those skilled in the art of solid freeform fabrication.

When the apparatus comprises more than one dispensing heads configured for raster scan, at least one of those dispensing heads preferably dispenses modeling material and at least one of those dispensing heads preferably dispenses support material.

In some embodiments of the present invention the apparatus comprises several dispensing heads configured for raster scan, and a single dispensing head configured for vector scan. Alternatively, the apparatus can comprise several dispensing heads for vector scan.

The raster scan heads and vector scan heads can be physically attached to each other or they can be configured for independent motion. When the raster scan heads and vector scan heads are physically attached to each other, the raster and vector scans are executed sequentially or intermittently. When the raster scan heads and vector scan heads are configured for independent motion, the raster and vector scans can be executed simultaneously, partially simultaneously, intermittently or in an alternating manner.

In some exemplary embodiments of the invention an object is manufactured by dispensing two or more different modeling materials, each material from a different dispensing head of the AM. The materials and combination of materials within the layer are selected according to the desired properties of the object.

Figure 1B:
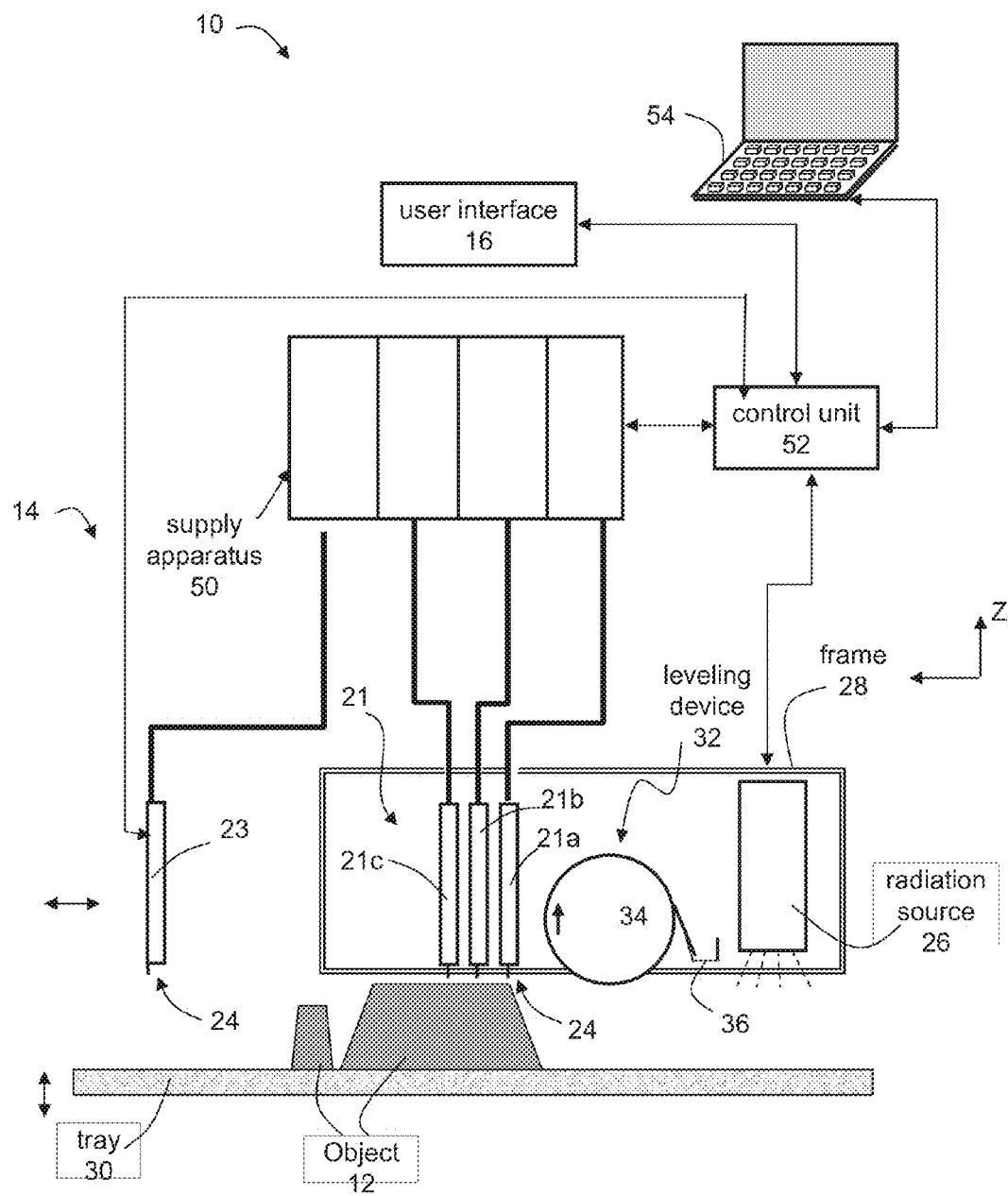
Figure 1C:
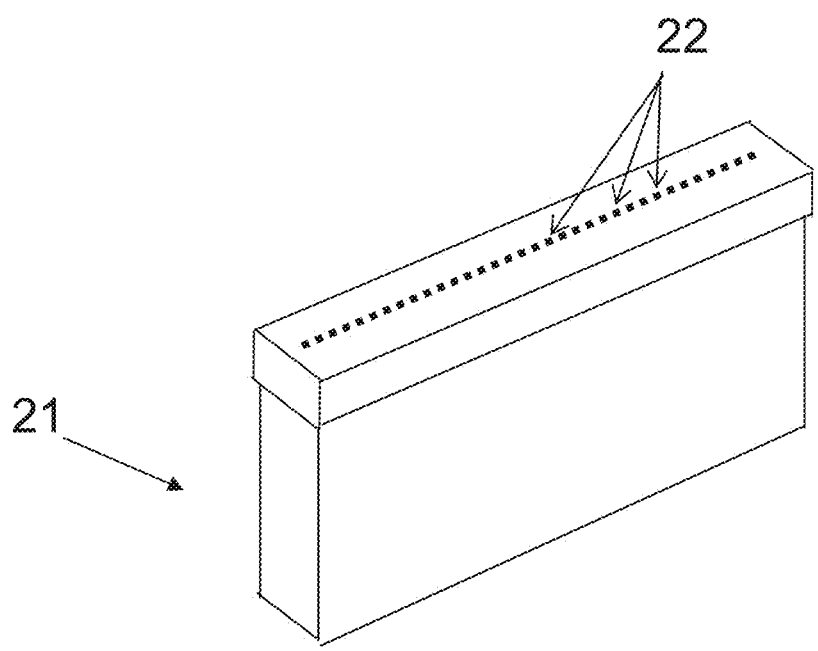

A representative and non-limiting example of a system 10 suitable for AM of an object 12 according to some embodiments of the present invention is illustrated in FIGS. 1A-1C.

System 10 comprises an additive manufacturing apparatus 14 having a dispensing unit 21 which comprises a plurality of dispensing heads 21a-d. Optionally, dispensing unit 21 comprises both heads configured for performing raster scan and heads configured for performing vector scan, e.g. as shown in FIG. 1A. Alternatively, dispensing unit 21 can comprise only heads configured for performing raster scan. In a different example of a system 10, unit 21 comprises a plurality of dispensing heads 21a-c, while a separate head 23 configured for performing vector scan deposition is located externally to unit 21 as illustrated in FIG. 1B.

Each head comprises at least one nozzle through which a building material 24 is dispensed. One or more of the heads (e.g., the raster scan heads) preferably comprises an array of nozzles 22, as illustrated in FIG. 1C.

Preferably, but not obligatorily, apparatus 14 is a three-dimensional printing apparatus, in which case the dispensing heads are printing heads, and the building material is dispensed via inkjet technology. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, binder jet—powder-based apparatus, fused deposition modeling apparatus and fused material deposition apparatus.

Each dispensing head is optionally and preferably fed via a building material reservoir which may optionally include a temperature control unit (e.g., a temperature sensor and/or a heating device), and a material level sensor. To dispense the building material, a voltage signal is applied to the dispensing heads to selectively deposit droplets of material via the dispensing head nozzles, for example, as in piezoelectric inkjet printing technology. The dispensing rate of each head depends on the number of nozzles, the type of nozzles and the applied voltage signal rate (frequency). Such dispensing heads are known to those skilled in the art of solid freeform fabrication.

Preferably, but not obligatorily, the overall number of dispensing nozzles or nozzle arrays is selected such that about half of the dispensing nozzles are designated to dispense support material and about half of the dispensing nozzles are designated to dispense modeling material.

In some embodiments of the present invention the number of support dispensing nozzles is about the same as the number of nozzles designated to dispense a modeling material. When there are two modeling materials, the number of support nozzles is preferably about one third of the overall number of nozzles.

Yet, it is to be understood that it is not intended to limit the scope of the present invention and that the number of modeling material depositing heads (modeling heads) and the number of support material depositing heads (support heads) may differ.

Apparatus 14 can further comprise a curing unit which can comprise one or more radiation sources 26, which can be, for example, an ultraviolet or visible or infrared lamp, or other sources of electromagnetic radiation, or electron beam source, depending on the modeling material being used. Radiation source 26 serves for curing or solidifying curable modeling material.

The dispensing heads and radiation source are preferably mounted in a frame or block 28 which is preferably operative to reciprocally move over a tray 30, which serves as the working surface. Vector scan printing heads may be mounted in block 28 or be a separate unit, as shown in FIG. 1B. According to the common conventions, tray 30 is positioned in the X-Y plane. Tray 30 is preferably configured to move vertically (along the Z direction), typically downward. In various exemplary embodiments of the invention, apparatus 14 further comprises one or more leveling devices 32, e.g. a roller 34. Leveling device 32 serves to straighten, level and/or establish a thickness of the newly formed layer prior to the formation of the successive layer thereon. Leveling device 32 preferably comprises a waste collection device 36 for collecting the excess material generated during leveling. Waste collection device 36 may comprise any mechanism that delivers the material to a waste tank or waste cartridge.

In use, the dispensing heads of system 10 move according to a predetermined scanning mode (raster scan or vector scan), and selectively dispense building material in a predetermined configuration in the course of their passage over tray 30. The building material typically comprises one or more types of support material and one or more types of modeling material. The passage of the dispensing heads of unit 21 is followed by the curing of modeling material(s) by radiation source 26. The passage of the dispensing heads can also be followed by leveling device 32 which straightens the layer thus formed.

Once the layer is completed, tray 30 is lowered in the Z direction to a predetermined Z level, according to the desired thickness of the layer subsequently to be printed. The procedure is repeated to form three-dimensional object 12 in a layerwise manner. Tray 30 can alternatively be displaced in the Z direction before the layer is completed, for example, between forward and reverse passages of the dispensing head of unit 21 during a raster scan.

System 10 optionally and preferably comprises a building material supply apparatus 50 which comprises the building material containers or cartridges and supplies a plurality of building materials to fabrication apparatus 14.

A control unit or controller 52 controls fabrication apparatus 14 and optionally and preferably also supply apparatus 50. Control unit 52 preferably communicates with a data processor 54 which transmits digital data pertaining to fabrication instructions based on computer object data, e.g., a CAD configuration represented on a computer readable medium in a form of a Standard Tessellation Language (STL) format or the like. Typically, control unit 52 controls at least one of the voltage applied to each dispensing head or nozzle array, the temperature of the building material in the respective dispensing head. Control unit 52 also selects the scanning mode of the respective dispensing head.

Once the manufacturing data is loaded to control unit 52 it can operate without user intervention. In some embodiments, control unit 52 receives additional input from the operator, e.g., using data processor 54 or using a user interface 16 communicating with unit 52. User interface 16 can be of any type known in the art, such as, but not limited to, a keyboard, a touch screen and the like. For example, control unit 52 can receive, as additional input, one or more building material types and/or attributes, such as, but not limited to, color, characteristic distortion and/or transition temperature, viscosity, electrical property, magnetic property. Other attributes and groups of attributes are also contemplated.

Some embodiments contemplate the fabrication of an object by dispensing different materials from different dispensing heads. These embodiments provide, inter alia, the ability to select materials from a given number of materials and define desired combinations of the selected materials and their properties or attributes. According to the present embodiments, the spatial locations of the deposition of each material with the layer is defined, either to effect occupation of different three-dimensional spatial locations by different materials, or to effect occupation of substantially the same three-dimensional location or adjacent three-dimensional locations by two or more different materials so as to allow post deposition spatial combination of the materials within the layer, thereby to form a composite material at the respective location or locations.

Any post deposition combination or mix of modeling materials is contemplated. For example, once a certain material is dispensed it may preserve its original properties. However, when it is dispensed simultaneously with another modeling material or other dispensed materials which are dispensed at the same or nearby locations, a composite material having a different property or properties to the dispensed materials is formed.

The present embodiments thus enable the deposition of a broad range of material combinations, and the fabrication of an object which may consist of multiple different combinations of materials, in different parts of the object, according to the properties desired to characterize each part of the object.

Further details on the principles and operations of an AM system capable of dispensing a plurality of modeling materials and modeling material combinations is found in U.S. Published Application No. 20100191360, the contents of which are hereby incorporated by reference.

When the AM is by three-dimensional printing, the viscosity of the building materials is preferably sufficiently low (e.g., 20 cps or less) to allow dispensing by ink-jet technology. In AM technique, it is advantageous to use UV curable materials as the building materials, since such materials enjoy enhanced properties. These types of materials are typically heated prior to deposition to reduce their viscosity.

Other types of building materials, such as conductive materials or inks and the like, may be used. In some embodiments conductive inks materials or inks contain a sufficient amount of low viscosity volatile solvents and therefore can be deposited at room temperature or at a temperature lower than 40° C., or at a sufficiently low temperature at which there is no significant solvent evaporation at the dispenser/nozzles, prior to dispensing.

Electrically conductive inks, for example, are typically produced by dispersing particles of an electrically conductive material, such as, but not limited to, silver or a conductive polymer material (e.g., PDOT-PSS) in a solvent.

The electrical conductivity increases with the content of conductive particles in the solvent. Thus, high conductivity is achieved using a high content of conductive particles. Further increment of conductivity is achieved by fusing several conductive particles together. Since these operations increase the viscosity of the ink, the conductive inks are prepared with a large amount of volatile solvents to be evaporated in situ.

It was found by the present inventor that it is problematic to expose low viscosity solvents to high temperatures due to premature solvent evaporation while the building material is still in the dispensing heads. It was also found by the present inventors that high temperatures may also damage the substrate on which the object is built, for example, when the substrate is a polymer.

The present inventor has therefore realized that it is problematic to dispense at the same temperature both UV curable materials which are too viscous at low temperatures and building materials which include volatile solvents.

The above problem has been inventively solved by a technique in which one building material is dispensed at a high temperature (e.g., above 60° C. or above 65° C. or above 70° C. or above 75° C. or at least 80° C.) and the other building material is dispensed at a low temperature (e.g., below 40° C. or below 35° C. or below 30° C.).

This can be done by individually controlling the temperature of each building material while being loaded to the respective dispensing head. Thus, in various exemplary embodiments of the invention controller 52 maintains at least two dispensing heads at different temperatures. Optionally and preferably, controller 52 effects raster scans for the dispensing of building materials at higher temperatures, and vector scans for the dispensing of building materials at lower temperatures. Alternatively, both building materials at higher temperatures and building materials at lower temperatures are dispensed during raster scans.

In an aspect of some embodiments of the present invention there is provided a method suitable for additive manufacturing of a three-dimensional object. The method can be executed using an AM system, e.g., system 10. The method comprises sequentially forming a plurality of layers each patterned according to the shape of a cross section of the object. In various exemplary embodiments of the invention at least one of the layers is formed by performing a raster scan to dispense at least a first building material composition, and a vector scan to dispense at least a second building material composition. The vector and raster scans can, as stated, be sequential or at least partially simultaneous.

One or both of the first and second building material compositions optionally and preferably comprise UV curing components. In some embodiments, the first building material composition is different from the second building material composition. For example, the first building material composition can be generally non-electrically conductive, and the second building material can be generally electrically conductive.

As used herein "generally non-electrically conductive" refers to a conductivity at room temperature of less than 1 S/m or less than 0.1 S/m or less than 0.01 S/m or less than $10^{-3}$ S/m or less than $10^{-4}$ S/m or less than $10^{-5}$ S/m.

As used herein "generally electrically conductive" refers to a conductivity at room temperature of at least 1 S/m or at least 10 S/m or at least 100 S/m or at least 1000 S/m or at least 10,000 S/m or at least 100,000 S/m.

The first and second building material compositions can be dispensed at the same or different temperatures, as desired. For example, the second building material composition can be a UV curable material including volatile solvent (e.g., water) and the first building material composition can be a UV curable material which is devoid of or has a reduced amount of volatile solvent. In these embodiments, the second building material composition can be dispensed at a temperature which is lower (e.g., by at least 20° C.) than the dispensing temperature of the first building material composition. Following the dispensing, the solvent can be evaporated from the second building material.

Vector scanning is advantageous for printing conductive "tracks", such as continuous elongated structures, as the vector deposition head may continuously deposit conductive material in its movement parallel to the XY plane. The vector dispensing heads may be located separately and proximate to the raster dispensing heads, and move over the fabrication area separately or in concert with the raster heads, and dispensing material separately and substantially simultaneously or sequentially to the raster dispensing, depending on the existence and spatial location of conductive tracks within a layer. For example, the raster dispensing heads may scan and selectively dispense building material, e.g. a non-conductive material, to form a layer, followed by selective vector dispensing of another material in predetermined spatial locations within the layer, e.g. a conductive material to form a conductive track or pattern with the layer.

The vector scan is along a path selected to form at least one structure in the layer. The structure can be for example, an elongated structure.

The term "elongated structure" refers to a three-dimensional body in which one of its dimensions is at least 2 times, more preferably at least 10 times, more preferably at least 100 times, e.g., at least 500 times larger than any of the other two dimensions. The largest dimension of the elongated solid structure is referred to herein as the longitudinal dimension, and the dimensions are referred to herein as the transverse dimensions.

Figure 2A:
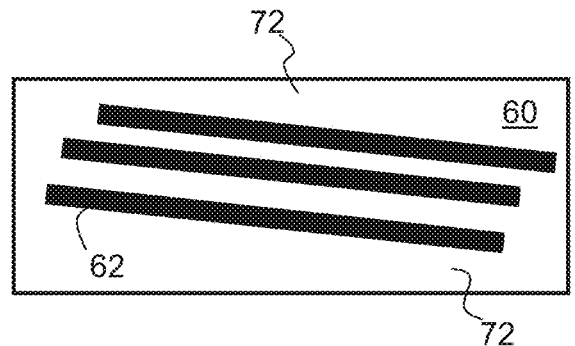
FIGS. 2A-2D are schematic illustrations of structures formed in a layer by vector scans according to some embodiments of the present invention.

A representative example of a plurality of elongated structures 62 formed in a layer 60 by vector scans are illustrated in FIG. 2A.

Figure 2B:
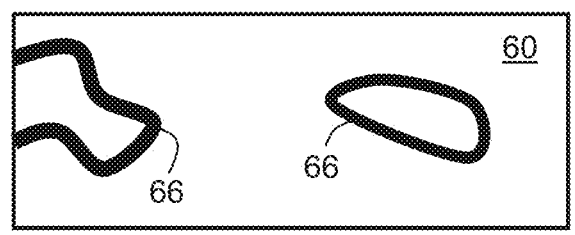

The structure can also be a boundary structure at least partially surrounding an area filled with the first building material. A representative example of a boundary structure 66 formed in layer 60 by a vector scans is illustrated in FIG. 2B.

Figure 2C:
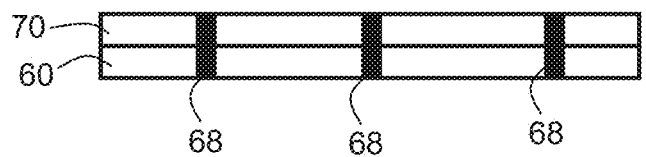

The structure can also be an inter-layer connecting structure. In these embodiments, the structure is preferably small (e.g., less than 1%) relative to the overall size of the layer. A representative example of inter-layer structure 68 connecting two layers 60 and 70 is illustrated in FIG. 2C.

The structure can also be embedded within an area formed by the raster scan. For example, referring again to FIG. 2A, the major area 72 of layer 60 can be formed by raster scan wherein structures 62 can be embedded within area 72.

Figure 2D:

The structure can also be peripheral with respect to a layer. This embodiment is illustrated in FIG. 2D showing layer 60 and structure 74 at its periphery.

The combination of raster and vector scans can be in any of the layers forming the object. Specifically, in some embodiments the combination of raster and vector scans is performed for an inner layer within a plurality of layers, in some embodiments the combination of raster and vector scans is performed for a topmost layer, and in some embodiments the combination of raster and vector scans is performed for a bottommost layer. The combination of raster and vector scans can also be performed in a plurality of layers, as desired.

Figure 3:
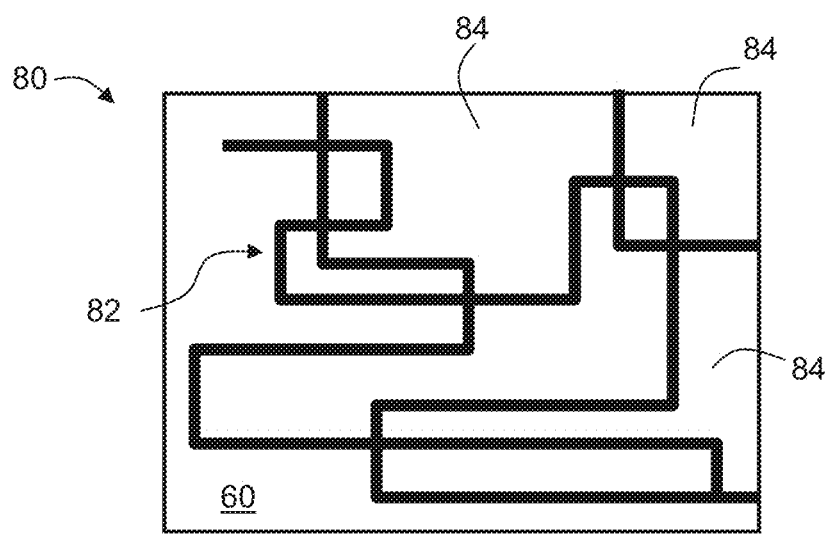
FIG. 3 which is a schematic illustration of an article of manufacture, according to some embodiments of the present invention.

Reference is now made to FIG. 3 which is a schematic illustration of an article of manufacture 80, according to some embodiments of the present invention.

Article of manufacture 80, typically comprises a plurality of layers 60 (only one layer shown in the top view of FIG. 3) made of non-electrically conductive material and fabricated via three-dimensional printing, wherein at least one of the layers comprises a pattern 82 of conductive lines made of electrically conductive material. Pattern 82 can be deposited on or embedded in regions 84 of non-electrically conductive material. Article of manufacture 80 can be fabricated by system 10 and/or by method described above.

Figure 4:
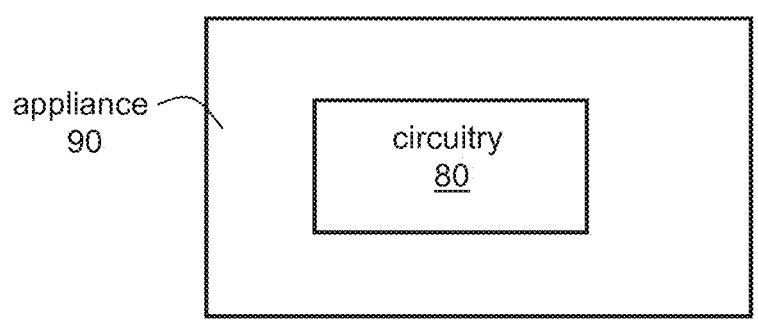
FIG. 4 is a schematic illustration of an appliance according to some embodiments of the present invention.

In some embodiments of the present invention article of manufacture 80 is a circuitry, e.g., a circuit board. FIG. 4 is a schematic illustration of an appliance 90 which includes circuitry 80. Appliance 90 is typically, but not necessarily, a large area electronic appliance. Representative examples of appliances suitable for the present embodiments include, without limitation, an optoelectronic system, a display system (e.g., an active matrix display system), a projector display system, a sensor, an identification tag, a memory medium, a smart card (e.g., a microprocessor card, cryptographic card, ATM card, subscriber identity module card also known as SIM card), and a projector display, a battery. Appliance 90 can also be an electronic component such as a diode system and a transistor system.

In some embodiments, materials able to solidify after deposition are employed and deposited from certain dispensers, for example UV curable materials. In addition materials which do not solidify are used and dispensed from other dispensers, for example electrolytes. In addition, materials which after deposition result in an electrically conductive material are used as well. All may be used together to build a single device such as, for example, a battery.

It is expected that during the life of a patent maturing from this application many relevant electronic appliances, particularly in the field of large area electronics will be developed and the scope of the term "appliance" is intended to include all such new technologies a priori.

One or more operations of the method of the present embodiments are implemented by a computer. Computer programs implementing the method of the present embodiments can commonly be distributed to users on a distribution medium such as, but not limited to, a floppy disk, a CD-ROM, a flash memory device and a portable hard drive. From the distribution medium, the computer programs can be copied to a hard disk or a similar intermediate storage medium. The computer programs can be run by loading the computer instructions either from their distribution medium or their intermediate storage medium into the execution memory of the computer, configuring the computer to act in accordance with the method of this invention. All these operations are well-known to those skilled in the art of computer systems.

The computer implemented method of the present embodiments can be embodied in many forms. For example, it can be embodied in on a tangible medium such as a computer for performing the method operations. It can be embodied on a computer readable medium, comprising computer readable instructions for carrying out the method operations. It can also be embodied in electronic device having digital computer capabilities arranged to run the computer program on the tangible medium or execute the instruction on a computer readable medium.

It is expected that during the life of a patent maturing from this application many relevant modeling materials for AM will be developed and the scope of the term modeling material is intended to include all such new technologies a priori.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of additive manufacturing of a three-dimensional object, comprising sequentially forming a plurality of layers each patterned according to the shape of a cross section of the object, thereby forming the object;
   wherein for at least one of said plurality of layers, said formation of said layer comprises operating a first dispensing head of an additive manufacturing system to perform a raster scan while dispensing at least a first building material composition by inkjet technology, and operating a second dispensing head of said additive manufacturing system to perform a vector scan while dispensing at least a second building material composition by a technology other than said inkjet technology.

2. The method of claim 1, wherein said first building material composition is different from said second building material composition.

3. The method of claim 1, wherein said first building material composition is generally non-electrically conductive, and said second building material is generally electrically conductive.

4. The method of claim 1, wherein at least one of said first and said second building material compositions comprises a UV curable component.

5. The method of claim 1, wherein said first and said second building material compositions are at different temperatures during said dispensing.

6. The method of claim 1, wherein said vector scan is along a path selected to form at least one structure selected from the group consisting of (i) an elongated structure, (ii) a boundary structure at least partially surrounding an area filled with said first building material, and (iii) an inter-layer connecting structure.

7. The method of claim 6, wherein at least one of said at least one structure is embedded within an area formed by said raster scan.

8. The method of claim 6, wherein at least one of said at least one structure is a peripheral with respect to said layer.

9. The method according to claim 1, wherein said vector scan is along a path selected to form a plurality of lines embedded in an area formed by said raster scan.

10. The method of claim 1, wherein said vector scan is at least partially simultaneous with said raster scan.

11. The method of claim 1, wherein said vector scan and said raster scan are performed sequentially.

12. The method of claim 1, wherein said at least one layer is an inner layer within said plurality of layers.

13. The method of claim 1, wherein said at least one layer is a topmost or a bottommost layer among said plurality of layers.

14. The method of claim 1, wherein said at least one layer comprises at least two layers.

15. The method of claim 1, further comprising evaporating solvent from said second building material.

16. The method of claim 1, wherein said first building material is dispensed during a relative motion in a straight line along a scanning direction but not during a relative motion along an indexing direction, said relative motion being between said first dispensing head and a working surface on which the object is manufactured.

17. The method of claim 1, wherein said second building material is dispensed during a relative motion along a path that is dynamically selected according to the computer image of a respective layer, said relative motion being between said second dispensing head and a working surface on which the object is manufactured.

18. The method of claim 1, wherein said other technology is selected from the group consisting of extrusion of a melted polymer, pressure based dispensing of a liquid, and pressure based dispensing of paste.

* * * * *